United States Patent [19]

Marquess

[11] 4,160,568
[45] Jul. 10, 1979

[54] STABLE PRELOAD SHOCK MOUNTED BEARING ASSEMBLY

[75] Inventor: Richard D. Marquess, Concord, Calif.

[73] Assignee: Systron-Donner Corporation, Concord, Calif.

[21] Appl. No.: 859,389

[22] Filed: Dec. 12, 1977

Related U.S. Application Data

[63] Continuation-in-part of Ser. No. 673,113, Apr. 2, 1976, abandoned.

[51] Int. Cl.² ..................... F16C 17/04; F16C 17/22
[52] U.S. Cl. .............................. 308/159; 308/2 A; 308/238; 324/155
[58] Field of Search ............... 308/2 R, 2 A, 26, 63, 308/70, 77, 158, 159, 166, 237 R, 238, DIG. 14; 403/226, 225, 228; 58/140 A; 324/154 PB, 155

[56] References Cited

U.S. PATENT DOCUMENTS 2,708,609  5/1955  Triplett ........................ 308/159

FOREIGN PATENT DOCUMENTS 880905  10/1961  United Kingdom ................ 308/158

Primary Examiner—Charles E. Frankfort
Attorney, Agent, or Firm—Flehr, Hohbach, Test, Albritton & Herbert

[57] ABSTRACT

A cylindrical bearing housing has an axial bore therethrough and external threads. A land is formed around the circumference of the bore having a width less than the axial length of the bore. A bearing member has a bearing surface on one end accessible through one end of the bore and has shoulders on each end of the bearing member. The bearing member is fabricated to pass through the bore and to have a length such that the shoulders are spaced apart a distance greater than the width of the land. An elastic filler material is disposed between the bearing member and the walls of the bore while the bearing member is suspended centrally therein, thereby retaining the bearing member axially in the bore. The bearing housing is configured for mounting and axial adjustment in a base member. A rotating member having a pair of pivots, one each on opposite sides thereof is provided having an axis of rotation passing through the pivots. When mounted bearing assemblies are positioned so that the bearing surfaces contact the pivots, a preload is set having improved stability over wide temperature variation. In one embodiment of the bearing assembly, the elastic filler material applies a shear force against the bearing member for preloading its bearing surface against the associated pivot. In another embodiment, separate apparatus, specifically a spring member applies a force against the back of the bearing member to at least aid in preloading the bearing surface against its associated pivot.

29 Claims, 11 Drawing Figures

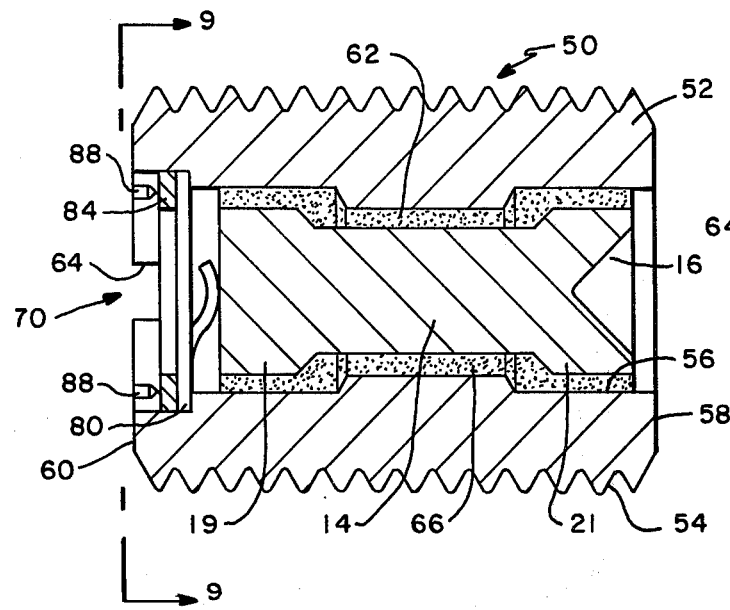
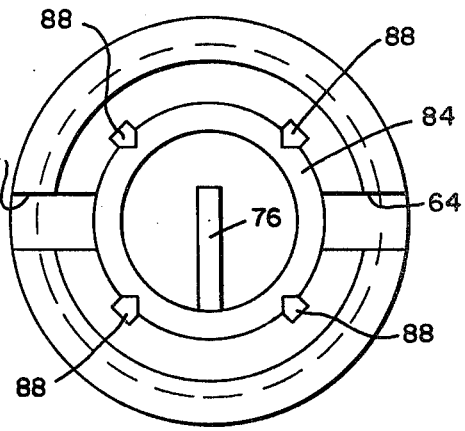
FIG.—8　　　　FIG.—9
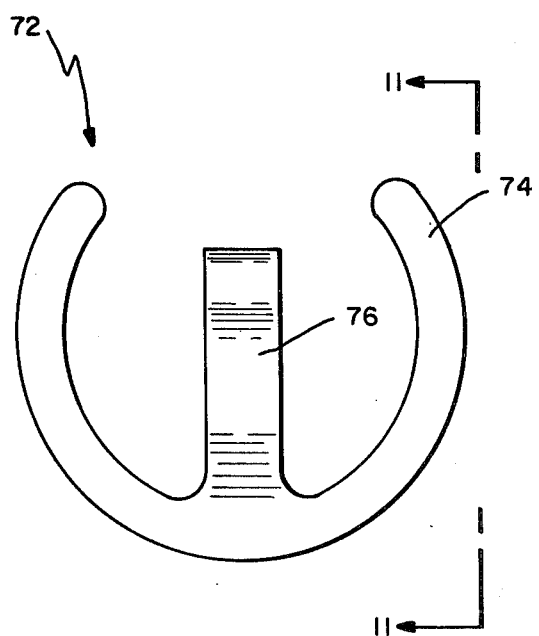
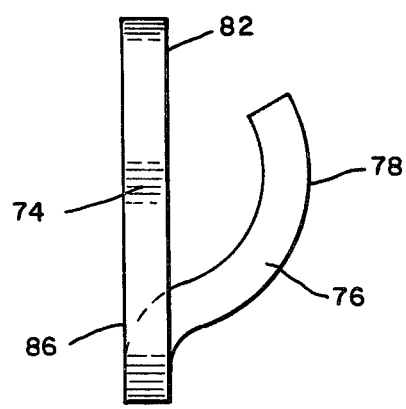
FIG.—10　　　　FIG.—11

STABLE PRELOAD SHOCK MOUNTED BEARING ASSEMBLY

REFERENCE TO PARENT APPLICATION

This application is a Continuation-in-Part of co-pending Parent Application, Ser. No. 673,113 filed Apr. 2, 1976, entitled STABLE PRELOAD SHOCK MOUNTED BEARING ASSEMBLY (now abandoned).

BACKGROUND OF THE INVENTION

This bearing assembly is for use with pivots and more particularly for use in rotary suspension systems requiring minimal bearing friction and minimal change therein.

Various types of pivot and jewel bearings are known which have been mounted in shock absorbent materials for protecting the bearing surfaces from damage when subjected to high shock and vibration levels. When subjected to wide variations in temperature range, these bearings have invariably exhibited a high degree of preload variation extending from total removal of bearing preload and resulting looseness along the pivot axis to marked increase in bearing preload and resulting high bearing rotational friction levels. Thus, known bearing assemblies with elastomeric isolation from shock and vibraton lose preload when cooled from the temperature at which they were adjusted due to contraction of the elastomer and, due to expansion of the elastomer, the preload increases drastically when the temperature is increased above the temperature of initial adjustment.

A shock and vibration isolated bearing is needed which provides compensation for temperature induced preload change due to temperature dependent dimensional characteristics of the shock absorbent member.

SUMMARY AND OBJECTS OF THE INVENTION

In one embodiment of the present invention, a bearing assembly is disclosed herein including a bearing housing having a passage extending therethrough and having a land on the wall of the passage such that the edges of the land are spaced from each end of the passage. A bearing member is centrally located in the passage having a bearing surface on one end, accessible through one end of the bore for contacting a mating pivot. A shoulder is formed on each end of the bearing member such that one shoulder is positioned on either side of the land. A resilient mass is disposed between the bearing member and the surface of the passage so that the bearing member is retained in the bearing housing. Shock and vibration transmission from the bearing housing to the bearing member is reduced and temperature induced dimensional change in the resilient mass produces volume expansion which exerts force in opposing directions against the shoulders on the ends of the bearing member. In this fashion, the resultant force from resilient mass volume change over temperature which urges the bearing member axially in the passage is minimized. In the embodiment just described, the resilient mass is solely responsible for applying a force, specifically a shear force, on the bearing member in the direction of its bearing surface for preloading the surface against its associated pivot, as will be discussed hereinafter. While this particular embodiment is generally satisfactory for its intended purpose, Applicant has found one aspect of the assembly which lends itself to improvement. More specifically, Applicant has found that if the resilient mass deteriates slightly with time, it could result in a slight reduction in the shear force it applies to the bearing member. This, in turn, might ultimately change the preload conditions between the bearing surface and its associated pivot.

In order to minimize the foregoing possibility, the bearing assembly includes separate means, preferably a spring member, for applying a separate force (apart from the shear force) against the bearing member to at least aid in preloading its bearing surface against the pivot, in accordance with a second embodiment of the present invention. As will be seen hereinafter, this spring member or other such means is not degradable with temperature as is the resilient mass. Accordingly, the force applied to the bearing assembly by this spring member or other such means is constant throughtime and regardless of temperature changes.

In a preferred embodiment, the force applied to the bearing member by the spring or other such means to aid in preloading its bearing surface against the pivot is at least equal to the shear force applied by the resilient mass. Accordingly, less shear force is required to preload the bearing surface, actually half the amount in the preferred embodiment, and hence any changes in the shear force resulting from temperature variations or degradation of the resilient mass is diluted by the added constant force which will not change. This means that the effect that a change in shear force has on the preload condition is also diluted. Moreover, Applicant has found that by utilizing a spring member, specifically a bearing flexure as it will be called, to provide this additional constant force, the preload condition of the bearing surface can be more accurately defined than is the case when utilizing only the shear force of the resilient mass.

It is an object of the present invention to provide a shock and vibration isolated bearing member having means for accurately setting a temperature stable bearing preload force.

It is another object of the present invention to provide a bearing assembly which reliably maintains its bearing preload force over long periods of time.

It is another object of the present invention to provide a bearing assembly having component parts with comparitively unsophisticated dimensional tolerances.

It is another object of the present invention to provide a bearing assembly for use in systems including rotationally moving parts which affords ease of assembly and stability of initially adjusted assembly features.

Additional objects will appear from the drawings and the following detailed description of the preferred embodiments.

BRIEF DESCRIPTION OF THE DRAWINGS

FIG. 8 is a sectional view of still another embodiment of a bearing assembly of the present invention.

FIG. 9 is an end view of the assembly of FIG. 8, taken generally along line 9—9 in FIG. 8.

FIG. 10 is a plan view of a spring member comprising part of the assembly illustrated in FIG. 8.

FIG. 11 is a side elevational view of the spring member illustrated in FIG. 10, taken generally along line 11—11 in FIG. 10.

DESCRIPTION OF THE PREFERRED EMBODIMENTS

Figure 1:
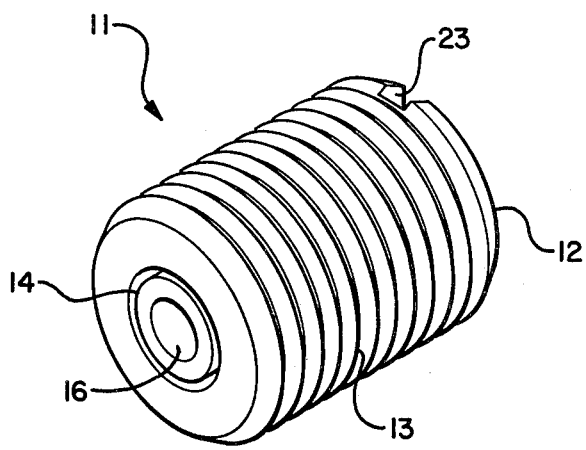
FIG. 1 is an isometric view of one embodiment of a bearing assembly of the present invention.

Referring to FIG. 1 an exterior view of a bearing assembly 11 disclosed herein is shown having an outer bearing housing 12 with threads 13 formed on the outer surface thereof. An internal bearing member 14 is seen having a bearing surface 16 on the end of the bearing member 14 which is externally accessible.

Figure 2:
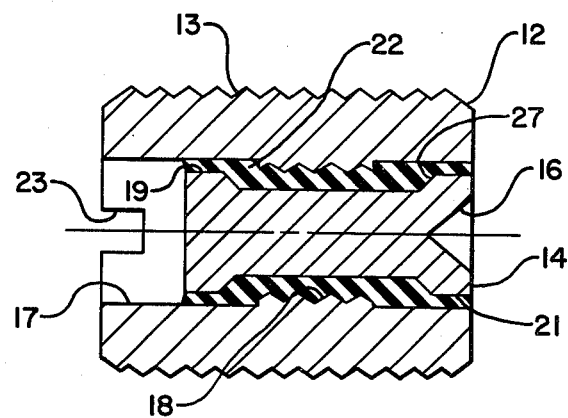
FIG. 2 is a sectional view of the bearing assembly of FIG. 1.

FIG. 2 shows outer bearing housing 12 having a bore or passage 17 passing therethrough and a land 18 having a width such that the sides of the land 18 are spaced from each end of the bore 17. In the embodiment of FIG. 2, land 18 has threads formed thereon. Internal bearing member 14 has a shoulder 19 formed on one end and a shoulder 21 formed on the opposite end. Shoulder 21 is formed on the end of bearing member 14 which carries bearing surface 16. Bearing member 14 has a length such that shoulders 19 and 21 are disposed on opposite sides of land 18 and spaced from edges of land 18. It should be noted that the distance between the edge of land 18 and shoulder 21 is greater than the distance between the edge of land 18 and shoulder 19. A resilient mass or elastic filler material 22 is disposed between the surface of bore 17 and the surfaces of bearing member 14. Notches 23 are placed in the end of bearing housing 12 on the end opposite that at which bearing surface 16 is accessible. Notches 23 are for receiving a tool, such as a screwdriver blade, for turning bearing housing 12 to adjust it in axial position when it engages internal threads as hereinafter described.

Figure 3:
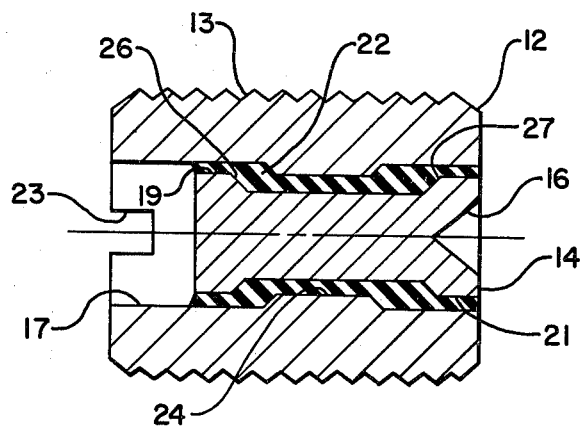
FIG. 3 is a sectional view of an alternate embodiment of a bearing assembly of the present invention.

FIG. 3 shows an embodiment similar to that of FIG. 2 except for the configuration of a land 24 in bore 17. Land 24 in FIG. 3 has an internal cylindrical surface as shown. Land 24 is disposed in the same relative position to bearing housing 12 and bearing member 14 as described for FIG. 2 above. Both land 24 in FIG. 3 and and 18 in FIG. 2 are for the purpose of retaining the resilient mass 22 in bore 17 and thereby retaining bearing member 14 in bore 17. As may be seen in FIG. 3, the distance between shoulder 19 and the nearest edge of land 24 is less than the distance between shoulder 21 and the nearest edge of land 24 when assembled initially.

When the bearing assembly of FIG. 2 or 3 is mounted in a structure engaging bearing housing 12, a pivot may be placed in contact with bearing surface 16 and outer bearing housing 12 advanced toward the pivot to impose a preload force between bearing surface 16 and the pivot. Resilient mass 22 is placed primarily in a condition of internal shear stress and is moved within bore 17 by the preload force to a point where the distance between shoulder 19 and the nearest edge of land 18 or 24 is relatively close to the distance between shoulder 21 and the nearest edge of lands 18 or 24. Thus, resilient mass 22 is primarily in shear and when dimensional change takes place therein due to exposure to temperature excursion, the force exerted by the resilient mass 22 against an edge 26 on shoulder 19 is similar to the force exerted on an edge 27 on shoulder 21. These forces may be seen to have components parallel with the axis of bore 17 which are in opposing direction, and therefore axial motion of bearing member 14 due to the resultant of the forces on edges 26 and 27 is minimized.

Figure 4:
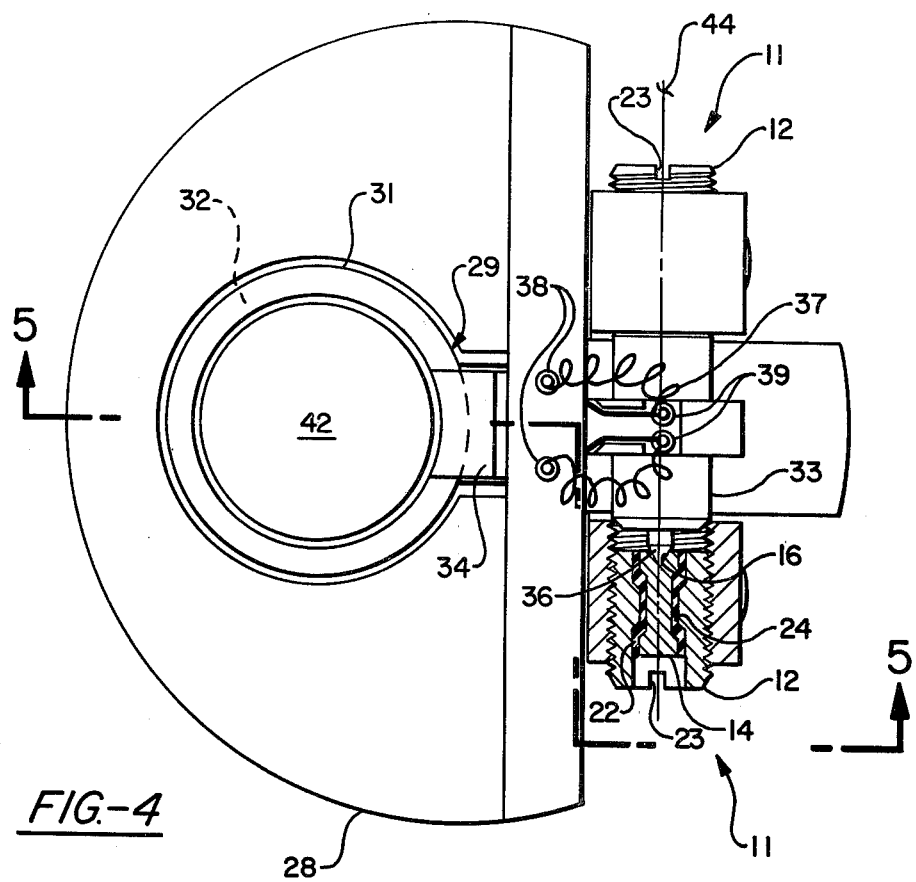
FIG. 4 is a top view of a moving system utilizing the disclosed bearing assembly of FIG. 3.

Turning to FIG. 4 an apparatus is shown which is a force balance mechanism having a magnetic return path 28 and a moving member 29. Moving member 29 is comprised of a coil form 31 carrying a coil 32 attached to a pivot block 33 by a coil form arm 34. A pivot 36 extends from each side of pivot block 33 for engagment with bearing surface 16 in each of a pair of bearing assemblies 11. A pair of flexible leads 37 extend between terminals 38 and 39 mounted on magnetic return path 28 and pivot block 33 respectively. Flexible leads 37 are for the purpose of transferring power to coil 32 on moving member 29.

Figure 5:
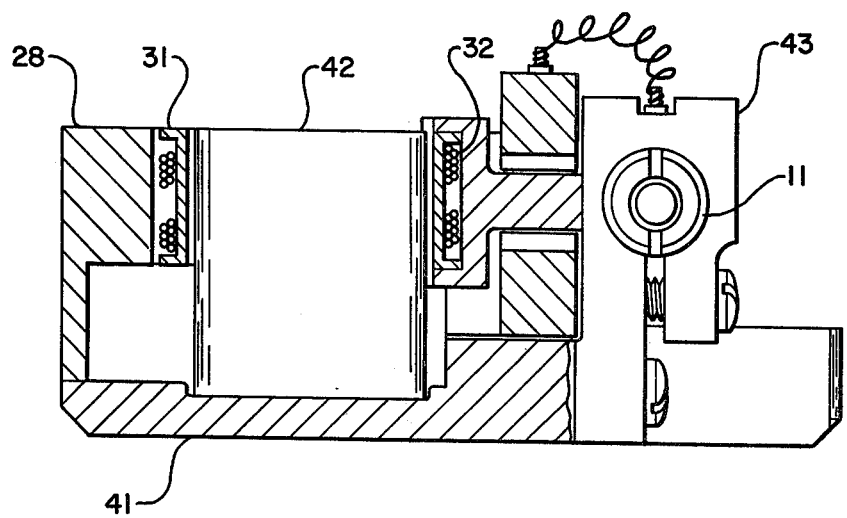
FIG. 5 is a sectional view along the line 5—5 of FIG. 4.

FIG. 5 shows a base member 41 supporting magnetic return path 28 and also a cylindrical magnet 42. Attached to base 41 is a bearing block 43 for mounting bearing assemblies 11 on an axis of rotation for moving member 29. The axis of rotation passes through pivots 36 and bearing surfaces 16 and is best seen at 44 in FIG. 4.

During the assembly of the apparatus of FIGS. 4 and 5, moving member 29 is positioned as shown and bearing assemblies 11 are placed to engage the internal threads in bearing blocks 43. A tool such as a screwdriver is used to engage notches 23 for turning outer bearing housing 12 to advance bearing assembly 11 until bearing surface 16 engages pivot 36. When both pivots 36 are engaged by bearing surfaces 16, additional advance of bearing housings 12 will impose a predetermined force between pivots 36 and bearing surfaces 16. Bearing members 14 are urged against pivots 36 by the shear stress set up in resilient mass 22. In this fashion, bearing surfaces 16 in pivots 36 are isolated from shock and vibration loads applied to base member 41 and bearing blocks 43 while wide temperature excursions imposed upon the apparatus do not appreciably change the predetermined bearing preload forces due to the cancellation affect of forces resulting from temperature induced dimensional change in the resilient mass 22 as explained above.

There are a number of error sources when sensing the position of moving member 29 in apparatus similar to that shown in FIGS. 4 and 5. Errors may arise from misalignment of the sensitive axis internally in the apparatus from the indicated external sensitive axis as carried by the external case for the apparatus. Moreover, the axis of rotation may be subject to lateral movement due to loosepreload forces between the bearing surfaces 16 and the pivots 36. In the case of a force balance instrument, low servo gain may also impart an error to the sensed position of the moving member 29. A typical sensor model equation for an accelerometer using a pivoted moving member such as that shown in FIGS. 4 and 5 is set forth below.

$$E_0 = K_0 + K_1 A + K_2 A^2$$

This equation assumes a bias error plus square law terms resulting from pivot axis position uncertainty, nonlinearity in the magnetic circuit, misalignment of the case and less than infinite servo gain. Since the quantity A is provided in the form $A = G \sin(\theta + \delta)$, and a rotating or tumble test is performed in a one G field, the following relationships exist.

$$E_0 \neq K_0 + K_1 G \sin(\theta + \delta) + K_2 G^2 \sin(\theta + \delta) = K_0 + K_1 G \sin(\theta + \delta) + K_2 G^2[\tfrac{1}{2} - \tfrac{1}{2} \cos(2\theta + 2\delta)] = K_0 + K_2 G^2/2 + K_1 G \sin(\theta + \delta) + K_2 G^2/2 \cos(2\theta + 2\delta)$$

In the above relationships $G=1$, $K_1$ is the scale factor, $K_0$ is the bias voltage, and $\delta$ is the case misalignment angle. The Fourier expansion of the last relationship above is:

$$E_0 = A_0 + B_1 \sin\theta + A_1 \cos\theta + B_2 \sin 2\theta + A_2 \cos 2\theta$$

The coefficients of the expansion are related to those in the sensor model equation as follows in a term by term comparison.

$$K_0 + \frac{K_2}{2} = A_0; \quad K_1 = \sqrt{A_1^2 + B_1^2}; \quad \frac{K_2}{2} = \sqrt{A_2^2 + B_2^2}$$

Figure 6:
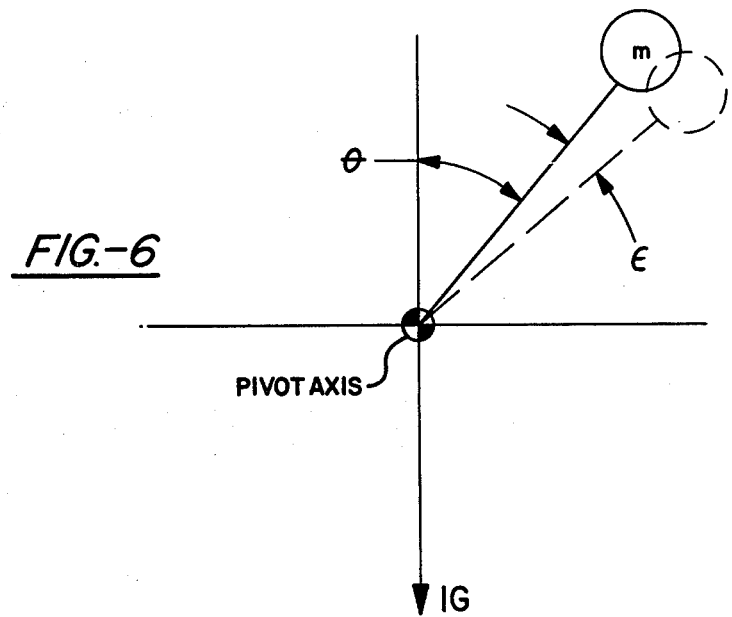
FIG. 6 is a mechanical diagram of a source of error in an instrument including a pivoted member.

Turning to FIG. 6, a physical model is shown for the case where the servo gain is less than adequate. $\theta$ is the angle between the moving member 29 and an acceleration vector, in this case the acceleration of gravity. Angle $\epsilon$ is the error angle which results due to less than infinite gain in the servo. The output from an accelerometer apparatus is described as $$E_0 = K_0 + K_1 G \sin(\theta + \epsilon)$$

Since $\epsilon = KG \sin\theta$, the following results, where K is the stiffines of the servo.

$$E_0 = K_0 + K_1 G \sin(\theta + KG\sin\theta) = K_0 + K_1 G[\sin\theta \cos(KG\sin\theta) + \cos\theta \sin(KG\sin\theta)]$$

The last relationship reduces to the following quantity where the approximations are made that the cosine of a small angle equals 1 and the sine of a small angle equals the angle in radians.

$$E_0 = K_0 + K_1 G \sin\theta + (K_1 K G^2/2) \sin 2\theta$$

The error term in the last expression is $(K_1 K G^2/2) \sin 2\theta$ which corresponds to the $B_2(\sin 2\theta)$ term in the Fourier expansion.

Figure 7:
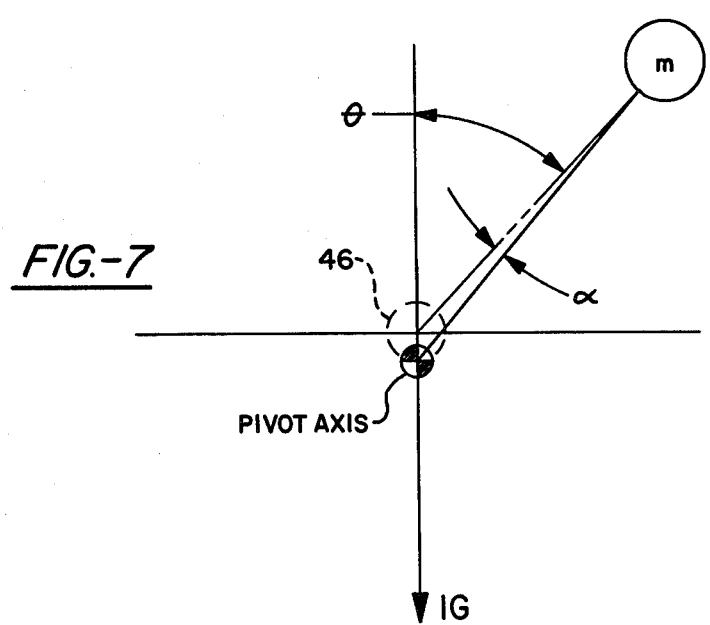
FIG. 7 is a mechanical diagram of an additional source of error in an instrument including a pivoted member.

Turning to FIG. 7, a graphical model of the condition of low bearing preload or looseness between pivots 36 and bearing surfaces 16 is shown where the pivot axis is allowed to move as the apparatus is rotated about the pivot axis in a one G field. The pivot axis moves relative to the axis of rotation of the apparatus, describing a circle 46 therearound seen in FIG. 7. Angle $\alpha$ is the difference between the angle of the moving system 29 carried within the case. In this instance the output of an instrument operating as an accelerometer and containing component parts similar to those of FIGS. 4 and 5, would appear as follows; $E_0 = K_0 + K_1 G \sin(\theta - \alpha)$. Since $\alpha$ is due to insufficient pivot axis position stiffness, it is G dependent and the equation below results.

$$E_0 = K_0 + K_1 G \sin(\theta - K^1 G \sin\theta)$$

In the last relationship above, $K^1$ is the pivot axis stiffness. The below relationship is derived.

$$E_0 = K_0 + K_1 G \sin\theta - (K_1 K^1 G^2/2) \sin 2\theta$$

The error term is the last term in the preceding equation which also corresponds to the $B_2 (\sin 2\theta)$ term in the Fourier expansion.

The foregoing is a cursory review of error terms in which $A_0$ results from instrument bias and is of mechanical origin. $A_1$ is due to the above mentioned instrument axis misalignment. The $B_1$ term is scale factor related. Magnetic circuit characteristics determine the $A_2$ term and servo gain characteristics determine the $B_2$ term. A negative sign associated with $B_2$ indicates loose preload in the bearings, while a positive sign indicates low servo gain. Optimum positioning of internal moving components reduces the magnitude of the coefficient $A_2$.

The chart below shows a coefficient comparison for two similar instruments operating over a wide temperature range. The instrument with the novel bearings clearly operates better than the one with prior art bearings. These test results are typical.

|  |  | Assembly with disclosed Disclosed Bearings | Assembly with prior Art Bearings |
|---|---|---|---|
| Room Temperature | $A_0$ | $1.29492 \times 10^{-2}$ | $2.94258 \times 10^{-2}$ |
|  | $A_1$ | $-5.15279 \times 10^{-5}$ | $-7.74977 \times 10^{-5}$ |
|  | $B_1$ | $8.54848$ | $8.5199$ |
|  | $A_2$ | $6.7675 \times 10^{-4}$ | $4.29284 \times 10^{-4}$ |
|  | $B_2$ | $-3.21027 \times 10^{-5}$ | $-7.71873 \times 10^{-6}$ |
| Low Temperature | $A_0$ | $5.15916 \times 10^{-3}$ | Inoperative |
|  | $A_1$ | $1.23811 \times 10^{-2}$ | At Low |
|  | $B_1$ | $8.60634$ | Temperature |
|  | $A_2$ | $8.14955 \times 10^{-4}$ |  |
|  | $B_2$ | $-1.32894 \times 10^{-4}$ |  |
| High Temperature | $A_0$ | $2.03666 \times 10^{-2}$ | $0.00215$ |
|  | $A_1$ | $-7.84495 \times 10^{-3}$ | $6.13219 \times 10^{-2}$ |
|  | $B_1$ | $8.53906$ | $8.50626$ |
|  | $A_2$ | $4.45068 \times 10^{-4}$ | $9.81175 \times 10^{-4}$ |
|  | $B_2$ | $-5.17104 \times 10^{-4}$ | $2.60637 \times 10^{-4}$ |

The chart above shows that in the instrument with the novel bearing assemblies the coefficient $B_2$ retains the same sign throughout the temperature range, and remains a small number, thereby indicating consistent bearing preload. The instrument with prior art bearing assemblies goes from a loose bearing preload indication at room temperature to an inoperatively loose condition at low temperature. High temperature creates a high bearing preload condition where $B_2$ assumes a positive value indicating low servo gain assumes the predominant role as an error source.

A bearing assembly for supporting pivoted members is disclosed which retains initially set bearing preload forces with reduced variation over a wide temperature range.

Having described the various embodiments of Applicant's bearing assembly illustrated in FIGS. 1 to 3 and the force balance mechanism illustrated in FIGS. 4 and 5, attention is now directed to a bearing assembly 50 which is constructed in accordance with still another embodiment of the present invention. This bearing assembly is illustrated in FIGS. 8 and 9 and includes many components which are similar or identical to the previously described bearing assemblies. For example, bearing assembly 50 includes an outer bearing housing 52 which, with two exceptions to be discussed hereinafter, may be identical to previously described housing 12. Accordingly, housing 52 includes threads 54 which are formed on its outer surface and which may be identical to previously recited threads 13 and a bore or passage 56 which passes through the housing from its front end 58 to its back end 60 in the same manner as previously recited bore or passage 17. Moreover, housing 52 may include a land 62 identical to the land 24, as illustrated, or the land 62 may be identical to previously described land 18. Finally, housing 52 may also include notch 64 identical to nothces 23, for the same reasons as previously recited notch 23.

Bearing assembly 50 also includes a bearing member which, in all respects, may be identical to previously described bearing member 14. Accordingly, the bearing member associated with assembly 50 has also been designated by the reference numeral 14 and includes previously described bearing surface 16 and previously described shoulders 19 and 21. As illustrated in FIG. 8, bearing member 14 is located within housing passage 56 such that bearing surface 16 which defines the front of bearing member 14, at least for purposes of description, is located adjacent to the front end 58 of the bearing housing and such that the back end of the bearing member is located adjacent the back end 60 of the housing.

In addition to housing 52 and bearing member 14, bearing assembly 50 also includes means 66 located between the bearing housing and bearing member for reducing the transmission of shock and vibration to the bearing member from the bearing housing as a result of shock and vibrations being applied to the latter. In a preferred embodiment, means 66 also applies a shear force against the bearing member in the direction of the bearing surface to aid in preloading the surface against its associated pivot, as described previously with respect to the embodiments illustrated in FIGS. 1 to 3. In fact, in accordance with the present invention, means 66 is identical to previously described resilient mass or elastic filler material 22 which provides these same functions, that is, the ability to dampen shock and vibration, otherwise transmitted to the bearing assembly, as discussed previously, and the ability to be placed in a condition of internal shear stress and thus produce a shear force for preloading the bearing surface 16 against its associated pivot. Accordingly, in this preferred embodiment, means 66, specifically a resilient mass, circumscribes the outer surface of bearing member 14 between the bearing member and the internal surface of bearing housing 52 which defines passage 17.

In accordance with the present invention, assembly 50 also includes an arrangement 70 connected with housing 52 adjacent its back end 60 for applying a force against the back end of bearing member 14 in the direction of bearing surface 16 to at least aid in preloading the bearing surface against an associated pivot, for example pivot 36 illustrated in FIG. 4. As will be seen below, in a preferred embodiment, arrangement 70 is constructed or designed such that the force applied against the bearing member remains substantially constant regardless of temperature changes at or in the vicinity of the arrangement. Moreover, as will also be seen, the components making up arrangement 70 are selected so as not to degrade or otherwise change with time to a degree which will cause the force it applied to the bearing assembly to change with time. Moreover, these components are selected to maintain this force constant regardless of changes in its temperature.

In the embodiment illustrated, arrangement 70 includes a spring member or bearing flexure which is generally designated by the reference numeral 72 and which is best illustrated in FIGS. 10 and 11. The bearing flexure is an integrally formed member which is constructed of a material which is capable of providing the desired spring force and preferably one which will maintain a constant spring force with time and regardless of temperature variations. In a preferred embodiment, the flexure is constructed of metal, specifically beryllium copper alloy. As seen in FIG. 10, this bearing flexure includes a somewhat U-shaped base 74 and an integrally formed flexure arm 76 which extends upward and outward from the bottom of the base in a curved fashion. The flexure arm includes a forwardmost contact area 78 which, as will be discussed below, is provided for engaging against the back end of bearing member 14.

As best seen in FIG. 8, bearing flexure 74 is located within housing 52 and across passage 56 in confronting relation with the back end of bearing member 14 so that surface 78 of flexure arm 76 engages or is adapted to engage the back end of the bearing member. In order to fix the bearing flexure in this position relative to housing 52, the latter defines a circumferential shoulder 80 which circumscribes passage 56 and which is normal to the axis of the passage. This shoulder, which comprises one difference between housing 52 and previously described housing 12 receives the front face 82 of base 74 of the bearing flexure for preventing the latter from moving inward relative to the housing. In order to prevent an outward movement of the bearing flexure arrangement 70 includes a retainer ring 84 which is best illustrated in FIG. 9 and which is located against the backside 86 (FIG. 11) of base 74. This retainer ring may be constructed of any suitable rigid material and, in a preferred embodiment, is a metal washer.

The retainer ring in order to maintain the bearing flexure in place must also be held in place. This is accomplished by means of a plurality of stakes 88 which in the embodiment illustrated comprise a second difference between housing 52 and previously described housing 12. These stakes 88 in the preferred embodiment are integral parts of the housing and are located at its back end. They are circumferentially spaced around passage 17 and are sufficiently bendable to stake down the retainer ring and bearing flexure tightly against previously described shoulder 80. In this way, as housing 52 is moved relative to bearing member 14 for applying a preload against its associated pivot, as described previously, bearing flexure 72 and retainer ring 84 move with the housing causing the flexure arm 76 to engage the back end of the bearing member (it it has not already done so) and ultimately to apply a spring force against the back end of the bearing member in the direction of bearing surface 16 for preloading the surface against its associated pivot.

As stated previously, in a preferred embodiment of the present invention, arrangement 70 acts in conjunction with means 66 for preloading bearing surface 16. More specifically, in this preferred embodiment, means 66 is not only responsible for reducing the transmission of shock and vibration to the bearing member but also is responsible for applying a shear force against the bearing member in the direction of the bearing surface which, coupled with the spring force provided by arrangement 70, preloads the bearing surface against the pivot. As also stated previously, in a preferred embodiment, the magnitude of the spring force is at least equal to the magnitude of the shear force so that any slight changes in shear force will be further diluted by the presence of a constant force at least equal to the shear force, specifically the spring force.

What is claimed is:

1. A bearing assembly for engaging a pivot comprising a bearing housing having a passage extending therethrough, a land on the wall of said passage, a bearing member disposed in said passage, a bearing surface on one end of said bearing member for contact with the pivot, a shoulder on each end of said bearing member disposed in spaced relation on opposite sides of said land, and a resilient mass extending between each of said shoulders and one side of said land, whereby said bearing member is retained in said bearing housing so that transmission to said bearing member of shock and vibration applied to said bearing housing is reduced, and temperature induced dimensional change in said resilient mass produces similar force magnitude on each of said shoulders, whereby resultant force urging axial displacement of said bearing member relative to said bearing housing is minimized.

2. A bearing assembly as in claim 1 wherein said shoulder adjacent to said bearing surface is spaced a greater distance from the edge of said land than said shoulder opposite, whereby preload force between the pivot and said bearing surface moves said bearing member axially against said resilient mass in said bearing housing until each shoulder is spaced a similar distance from one edge of said land.

3. A bearing assembly as in claim 1 wherein said resilient mass extends between said bearing member and said land together with threads on said land, whereby said resilient mass is fixed axially in said passage.

4. A bearing assembly as in claim 1 including means connected with said housing for applying a force against the end of said bearing member opposite said bearing surface, said force being applied in the direction of said bearing surface to at least aid in preloading said surface against said pivot.

5. A bearing assembly as in claim 4 wherein said force applying means includes a spring member for applying said force, said spring member being constructed of a substantially nondegradable material.

6. A bearing assembly as in claim 5 wherein said spring material is constructed of metal.

7. A bearing assembly as in claim 6 wherein said metal is beryllium copper alloy.

8. A bearing assembly for engaging a pivot comprising a bearing housing having a bore extending therethrough, a land on the wall of said bore having first and second sides spaced from the ends of said bore, and defining a land width therebetween, a bearing member, first and second shoulders on the ends of said bearing member spaced apart a distance greater than said land width, said bearing member being configured for disposition centrally in said bore spaced from the walls thereof and the surface of said land, said first shoulder being spaced from said first land side through a distance greater than said second shoulder is spaced from said second land side, an elastic filler in the space between said bearing member and said bore for retaining said bearing member in said bore, and a bearing surface on one end of said bearing member adjacent said first shoulder, whereby preloading said bearing surface against the pivot shifts the bearing member against said elastic filler so that said first and second shoulders are spaced substantially the same distance from said first and second land sides respectively.

9. A bearing assembly as in claim 8 wherein said land has a threaded surface for improving axial retention of said elastic filler in said bore.

10. A bearing assembly as in claim 8 including means connected with said housing for applying a force against the end of said bearing member opposite said bearing surface, said force being applied in the direction of said bearing surface to aid in preloading said surface against said pivot.

11. A bearing assembly as in claim 10 wherein said force applying means includes a spring member for applying said force, said spring member being constructed of a substantially nondegradable material.

12. A bearing assembly as in claim 11 wherein said spring material is constructed of metal.

13. A bearing assembly as in claim 12 wherein said metal is beryllium copper alloy.

14. An apparatus providing for relative rotational motion between components thereof, comprising a moving member having an axis for rotation, a base member having an axis of rotation, a pair of pivot members attached to opposite sides of said moving member on said axis for rotation, a pair of bearing housings mounted in said base member, said bearing housings having a bore therethrough with the bore axis aligned with said axis of rotation of said moving member, a bearing member disposed in each of said bearing housing bores, a bearing surface on the end of said bearing members accessible from one end of said bearing housing bore and contacting said pivot members, a land in each of said bearing housing bores spaced from the ends thereof, a shoulder on each end of said bearing member so that when said bearing members are disposed in said bearing housing bores one of said shoulders is spaced from each side of said land, and a resilient filler disposed between the surfaces of said bore and said bearing member and operating to retain said bearing member therein, and means for adjusting the position of said bearing housings along the axis of said bore, so that a predetermined preload force is set between ones of said pivot members and said bearing surface opposed by internal stress in said resilient filler, whereby temperature induced dimensional changes in said resilient filler produce opposing forces against said bearing member shoulders and deviation of said predetermined preload force is reduced.

15. An apparatus as in claim 14 wherein prior to application of said predetermined preload force the spacing between the side of said land and said shoulder on the end of said bearing member having said bearing surface is greater than the spacing between the other side of said land and the other of said shoulders, so that after said predetermined preload force is set the difference between said spacings is reduced and difference between the temperature induced opposing forces is reduced.

16. An apparatus as in claim 14 together with threads in the surface of said land, whereby axial retention of said bearing member in said bore is improved.

17. An apparatus as in claim 14 including means connected with each of said housings for applying a force against the end of an associated bearing member opposite its bearing surface, said force being applied in the direction of said bearing surface to aid in preloading said surface against said pivot.

18. A bearing assembly as in claim 17 wherein said force applying means includes a spring member for applying said force, said spring member being constructed of a substantially nondegradable material.

19. A bearing assembly as in claim 18 wherein said spring material is constructed of metal.

20. A bearing assembly as in claim 19 wherein said metal is beryllium copper alloy.

21. A bearing assembly for engaging a pivot comprising a bearing housing having a front end, a back end and a passage extending therethrough from said front end to said back end, a bearing member having a front end and back end and being disposed within said passage, said member including on the front end thereof a bearing surface located adjacent the front end of said housing and adapted for engagement with said pivot, said bearing member being axially movable within said passage relative to said housing whereby to preload said bearing surface against said pivot, first means located between said bearing housing and said bearing member for reducing the transmission to said bearing member of shock and vibration applied to said housing and for applying a shear force against said bearing member in the direction of said bearing surface for preloading said surface against said pivot, said first means being such that said shear foce varies to a limited degree with changes in temperature, and second means connected with said housing adjacent the back end thereof for applying an additional force against the back end of said bearing member in the direction of said bearing surface to aid said shear force in preloading said surface against said pivot, said second means being such that said additional force remains substantially constant regardless of temperature changes at said second means.

22. A bearing assembly as in claim 21 wherein said second force applying means includes a spring member for applying said additional force, said spring member being constructed of a substantially nondegradable material.

23. A bearing assembly as in claim 22 wherein said spring material is constructed of metal.

24. A bearing assembly as in claim 23 wherein said metal is beryllium copper alloy.

25. A bearing assembly as in claim 22 wherein said second force applying means includes means for fixedly connecting said spring member to said housing and against said back end of said bearing member.

26. A bearing assembly as in claim 21 wherein said shock and vibration reducing first means includes a resilient mass located within said passage and circumscribing the outer surface of said bearing member between.

27. A bearing assembly as in claim 21 wherein said additional force is at least equal in magnitude to said shear force.

28. A bearing assembly for engaging a pivot, comprising:
 (a) a bearing housing having a front end, a back end and a passage extending therethrough from said front end to said back end;
 (b) a bearing member having a front end and a back end being disposed within said passage, said bearing member including on its front end a bearing surface located adjacent the front end of said housing and adapted for engagement with said pivot, said bearing member being axially movable within said passage relative to said housing, whereby to preload said bearing surface against said pivot;
 (c) a resilient mass located within said passage, concentrically around said bearing member between said member and said housing, said mass
  (i) reducing the transmission to said bearing member of shock and vibration applied to said housing and
  (ii) applying a shear force against said bearing member in the direction of said bearing surface to aid in preloading said surface against said pivot, said resilient mass being such that said shear force varies to a limited extent with changes in temperature; and
 (d) a metal spring member connected with said housing adjacent the back end thereof for applying an additional force against the back end of said bearing member in the direction of said bearing surface to aid in preloading said surface against said pivot, said last-mentioned force being at least as large in magnitude as said shear force and said spring member being such that said additional force remains substantially constant regardless of temperature changes at said spring member.

29. A bearing assembly as in claim 28 wherein said spring member is constructed of beryllium copper alloy.

* * * * *